United States Patent [19]

Forward et al.

[11] 4,242,656
[45] Dec. 30, 1980

[54] CURRENT PUMPED VOLTAGE DIVIDED ABSORBOR

[75] Inventors: Robert L. Forward, Oxnard; Dale M. Sipma, Sherman Oaks, both of Calif.

[73] Assignee: Hughes Aircraft Company, Culver City, Calif.

[21] Appl. No.: 46,746

[22] Filed: Jun. 8, 1979

[51] Int. Cl.³ .................... H03H 11/46; H03H 11/54
[52] U.S. Cl. .................................... 333/213; 307/229
[58] Field of Search .................. 330/84, 109; 307/229; 333/213, 215, 217

[56] References Cited
U.S. PATENT DOCUMENTS 3,493,901  2/1970  Deboo ................................. 333/215

Primary Examiner—Paul L. Gensler
Attorney, Agent, or Firm—William J. Benman, Jr.; W. H. MacAllister

[57] ABSTRACT

A two-terminal active network which simulates a low noise-temperature resistor is disclosed. In a preferred embodiment, a pair of operational amplifiers, each connected in the manner of a "current pump," comprises the active elements of the network. A resistive voltage divider network provides both positive and negative feedback to the operational amplifiers. Simulated resistors can be obtained with a wide range of equivalent resistance values and effective noise temperatures.

4 Claims, 3 Drawing Figures

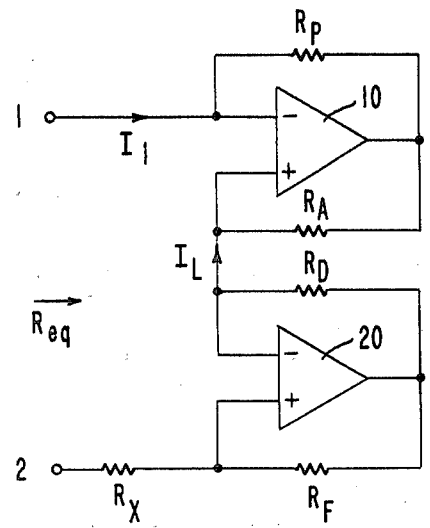
Fig. 1.
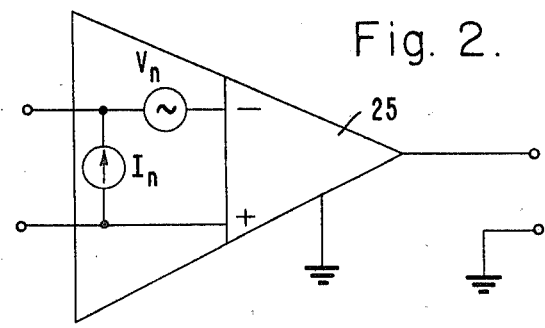
Fig. 2.
Fig. 3.
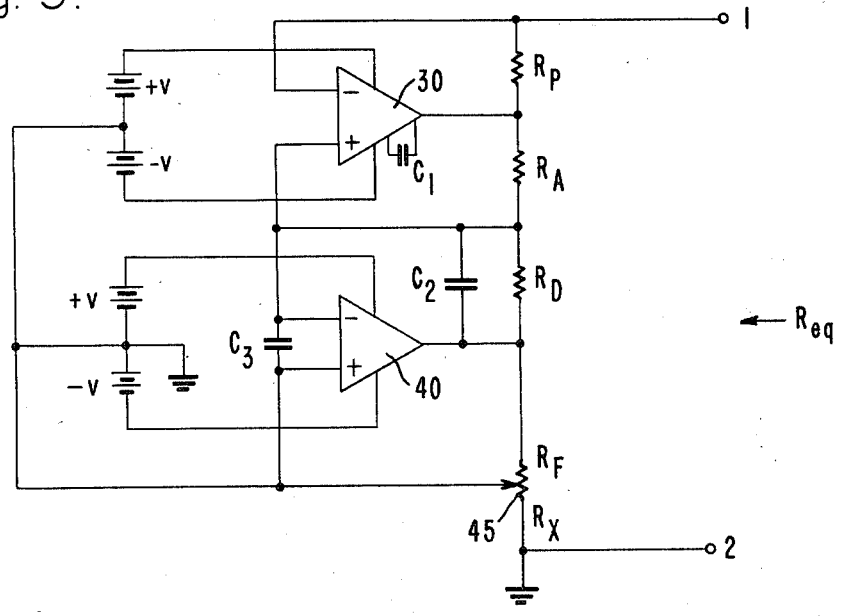

CURRENT PUMPED VOLTAGE DIVIDED ABSORBOR

TECHNICAL FIELD

This invention relates to single-port electrical networks and more particulary to networks which simulate low-noise temperature electrical resistors.

BACKGROUND OF THE INVENTION

It has long been known that all electrical resistors are characterized by an inherent noise which is due to the thermal agitation of the free electrons within the resistor material. As used herein, the term "resistor", includes any body of conductive material capable of carrying an electrical current. As such, the term embraces components such as wires and other conductors which are not ordinarily thought of "resistors". If a signal current in the resistor or conductor is smaller than the random current due to thermal agitation then, as practical matter, the signal is masked by the noise and no amount of amplification can separate them. This noise, known as "thermal noise", "Johnson noise" or "white noise", has heretofore generally been accepted as one of the limiting factors in the design of low-level signal processing circuits.

From the research of Johnson and Nyquist in the late 1920s, it is known that the thermal noise voltage across the open ends of a resistor is determined by the formula:

$$N^2 = 4kTRB \qquad [1]$$

Where $N^2$ is the average of the square of the noise voltage; k is Boltzmann's constant ($1.38 \times 10^{-23}$ joules per °K.); T is the absolute temperature of the conductor in °K.; R is the resistance of the resistor or conductor in ohms and B is the bandwidth in Hertz over which the noise is measured.

In order to reduce the thermal noise of a given resistance R, it is seen from Equation [1] that either the temperature (T) or the bandwidth (B) must be reduced. In general, therefore, it has been the practice to minimize the thermal noise by cooling the resistor or the entire circuit, in some cases to cryogenic temperatures. However, since the noise voltage is proportional to the square root of the temperature, it is readily understood that it is both costly and cumbersome to provide the degree of cooling required to achieve a significant reduction in thermal noise.

It is therefore an object of the present invention to provide a non-cryogenically cooled low-noise-temperature resistance.

In 1939, it was suggested by W.S. Percival that a simulated resistor having an effective noise temperature lower than ambient temperature could be realized by feedback means. (See: W.S. Percival, An Electrically "Cold" Resistance, the Wireless Engineer, Vol. 16, May 1939, pp. 237-240.) Utilizing a single transformer between the plate and grid circuit of a vacuum tube amplifier, Percival simulated a resistance having an effective temperature of 70° K. The same technique was later expanded upon by Strutt and Van der Ziel in an article entitled, "Suppression of Spontaneous Fluctuations in Amplifiers and Receivers for Electrical Communication and for Measuring Devices", Physica, Vol. 9, No. 6, June 1942, pp. 513, 527. Professor Van der Ziel also briefly summarized the techniques in his treatise "Noise", Prentice-Hall, New York, N.Y. 1954, pp. 281-283. (See also: U.S. Pat. No. 2,352,956; M. J. O. Strutt, et al.; July 4, 1944.)

The circuits of the prior art appear to have received little attention in the several decades since their introduction. This may be due to the many shortcomings in the use of vacuum tubes such as their high operating temperatures and the other sources of noise inherent therein. In any event, recent advances in solid state technology have produced many sophisticated, highly efficient, low-cost active circuit elements which allow the synthesis of economical low-noise-temperature resistance simulating circuits.

It is yet another object of the present invention to provide an active circuit which simulates a low-noise resistor.

In several copending applications filed on behalf of the applicant R. L. Forward, either solely or with others, there are disclosed several classes of circuits which simulate low noise-temperature resistors. In application Ser. No. 838,511 filed Oct. 3, 1977 now U.S. Pat. No. 4,156,859 there is disclosed a class of active circuits utilizing operational amplifiers with one or more transformers forming the intra-circuit interconnections. Another copending application Ser. No. 881,296, filed Feb. 27, 1978 now U.S. Pat. No. 4,176,331 also utilizes operational amplifiers but with a resistive voltage divider network comprising the remainder of the circuit. Application Ser. No. 018,688, filed Mar. 8, 1979 utilized field effect transistors in the preferred embodiment. All of the aforesaid copending applications are characterized by advantages which lend themselves to particular uses. Depending upon the requirements of the job at hand, any of the above-mentioned classes of circuits may be advantageously employed.

SUMMARY OF THE INVENTION

In some applications, it may also be desirable to utilize the design flexibility offered by yet another class of circuits which simulate low noise-temperature resistors. In keeping with the principles of the present invention, the above and other objects are accomplished in a single-port circuit which utilizes a pair of operational amplifiers and a resistive voltage divider network. The operational amplifiers are interconnected with the resistive network utilizing both negative and positive feedback so as to form a pair of so-called "Howland current pumps", with one of the current pumps serving as the load for the other.

By selecting the proper resistance values for the voltage divider network, the overall circuit can be made to simulate a resistor having a wide range of values. The equivalent resistance thus simulated can be made to display a thermal noise contribution which is much less than that expected of a passive resistor operating at the same temperature.

BRIEF DESCRIPTION OF THE DRAWING

The above mentioned and other features and objects of the present invention will become more apparent by reference to the following description taken in conjunction with the accompanying drawing wherein like reference numerals denote like elements and in which:

FIG. 1 is a simplified schematic diagram of a preferred embodiment of the present invention;

FIG. 2 is a circuit model of an operational amplifier illustrating its input-referred voltage and current noise sources; and FIG. 3 is a more detailed schematic diagram of a modified embodiment of the invention with biasing and compensating circuitry added.

DETAILED DESCRIPTION

In FIG. 1 there is shown a simplified schematic diagram of a preferred embodiment of the present invention. A voltage divider network comprising the serial combination of resistors $R_P$, $R_A$, $R_D$, $R_F$ and $R_X$ is connected between a pair of network terminal 1-2. A first differential input operational amplifier (op-amp) 10 is provided with its inverting input connected to network terminal 1, its output connected to the junction of resistors $R_p$ and $R_A$, and its non-inverting input connected to the junction of resistors $R_A$ and $R_D$. A second op-amp 20 has its inverting input also connected to the junction of resistors $R_A$ and $R_D$, its output connected to the junction of resistors $R_D$ and $R_F$ and its non-inverting input connected to the junction of resistors $R_F$ and $R_x$. For the sake of clarity, the direct current power supply connections have been omitted from the diagram of FIG. 1 but rather are shown in connection with FIG. 3 hereinbelow.

An understanding of the circuit of FIG. 1 may be more easily gained when it is analyzed in terms of its two constituent "current pump" sections. The basic Howland current pump is shown, for example, in the handbook "Applications Manual for Computing Amplifiers for Modelling, Measuring, Manipulating and Much Else," Philbrick Researches, Inc., Nimrod Press, Bos, Mass., 1966 at p. 66, (FIG. 3.6). The first current pump section of the embodiment of FIG. 1 comprises op-amp 10, negative feedback resistor $R_P$, positive feedback resistor $R_A$, and the load which, in this case, is the second current pump section. The second current pump section of the embodiment is comprised of the second op-amp 20, negative feedback resistor $R_D$, positive feedback resistor $R_F$ and load $R_x$.

In general, the current pump is characterized by its ability to drive its load with a current $I_L$ which is proportional to its input current $I_i$. In the case of the first current pump section mentioned above, the input current is the current flowing through the lower or second current pump section. That is, the load current for the first current pump is the input current to the second current pump—with due regard to sign convention.

The load current for the Howland current pump is:

$$I_L = I_i \frac{R_p}{R_A} = I_i M_A, \qquad [2]$$

in the case of the first current pump section, and:

$$I_L' = I_i' \frac{R_D}{R_F} = I_i' M_F \qquad [3]$$

in the case of the second current pump section. $M_A$ and $M_F$ can be termed the current gain factors for the first and second current pump sections, respectively, and are useful parameters in defining the network operation.

The behavior of either of the current pump sections of the network of FIG. 1, taken alone, is described in the aforementioned Philbrick Handbook. When two such current pumps are combined as in FIG. 1 however, and the combination analyzed in terms of its equivalent resistance and noise behavior, some interesting benefits are seen. In order to make this analysis however it is first necessary to consider the noise behavior of the operational amplifier as a circuit element.

In FIG. 2 there is shown a schematic representation of a circuit model of an operational amplifier which, as a first approximation, takes into account its input-referred noise components. The circuit model of the op-amp of FIG. 2 comprises an ideal section 25 with its conventional inverting and non-inverting input ports and an output port. The op-amp noise sources are modeled as a series voltage-noise generator $V_n$ and a shunt current-noise generator $I_n$ at the input ports.

The noise model of FIG. 2 can be substituted for each of the op-amp 10 and 20 of FIG. 1 for analysis. When this is done it is found that the equivalent resistance $R_{eq}$ looking into the input port 1-2 of the circuit is given as:

$$R_{eq} = \frac{(R_D + R_F)}{M_A \cdot M_F} + \frac{R_F}{M_F}. \qquad [4]$$

Again, $M_A$ and $M_F$ represent the current gain factors of the first and second current pump sections, respectively.

A lengthy analysis of the noise behavior of the network of FIG. 1 yields a value for the square of the noise voltage output of:

$$N_{OUT}^2 = \left(\frac{R_{eq}}{R_p} - 1\right)^2 V_2^2 + \left(1 + \frac{1}{M_F}\right)^2 V_1^2 + \\ (M_A + 1)^2 I_2^2 R_{eq}^2 + M_A^2 I_1^2 R_{eq}^2 + \\ 4kB\left(\frac{R_{eq}}{R_A} + \frac{R_{eq}}{R_p}\right) T R_{eq} + 4kB\left(\frac{M_A}{M_F}\right) T R_{eq}, \qquad [5]$$

Where $V_1$ and $V_2$ are the noise voltages $V_n$ and $I_1$ and $I_2$ are the noise currents $I_n$ of op-amps 10 and 20, respectively. Also, as in Equation 1, k is Boltzmann's constant, T is the ambient temperature and B is the bandwidth over which the noise voltage is measured.

An examination of Equation [5] reveals a complex relationship among a number of variables and the equivalent noise of the embodiment of FIG. 1. It can be stated, however, and is borne out by the experimental evidence explained hereinbelow, that in order to realize a simulated resistor having a low-noise behavior, then not only must $M_A/M_F << 1$ but also $R_A$ and $R_p >> R_{eq}$.

In FIG. 3 there is shown a schematic diagram of an experimental version of the embodiment of FIG. 1, but in rather more detail. In FIG. 3 the combination of fixed resistors $R_F$ and $R_X$ have been replaced by a potentiometer 45 for ease of adjustment. In addition, capacitors $C_1$, $C_2$, and $C_3$ have been added in order to provide frequency compensation and to prevent oscillation. Such compensation and stabilization techniques are well known in the art and are common engineering modifications. Direct current voltage source $+V$ and $-V$ have also been added.

In the experimental embodiment op-amps 30 and 40 were model LM 308s manufactured by National Semiconductor. $C_1$, $C_2$, and $C_3$ had approximate values of 20 picofarads, 5 picofarads and 200 to 500 picofarads respectively. A number of different values for resistors $R_P$, $R_A$, $R_D$, $R_X$ and $R_F$ were used. The value of potentiometer 45 and therefore the combined quantity $R_F + R_X$ was 10,000 ohms.

A series of noise measurements were taken and compared with corresponding values calculated according to Equation [5]. These values are reproduced in Table 1 below.

TABLE 1

| Exp. | $R_P$ | $R_A$ | $R_X$ | $R_F$ | $R_D$ | $R_{eg}$ | $N^2$ (meas) | $N^2$ (calc) |
|---|---|---|---|---|---|---|---|---|
| 1 | 5 kΩ | 5 k Ω | 930 Ω | 9.07 kΩ | 1 MΩ | 100 kΩ | 1398* | 2280* |
| 2 | 100 K | 100 K | 930 | 9.07 K | 1 M | 100 K | 40 | 32 |
| 3 | 10 M | 1 M | 900 | 9.1 K | 100 K | 100 K | 4.3 | 5.9 |
| 4 | 10 M | 1 M | 1000 | 9.0 K | 100 K | 100 K | 2.2 | 1.8 |
| 5 | 54 M | 5.4 M | 100 | 9.9 K | 1 M | 100 K | 1.5 | 1.3 |
| 6 | 54 M | 54 M | 930 | 9.07 K | 1 M | 100 K | 4.4 | 4.6 |
| 7 | 54 M | 54 M | 100 | 9.9 K | 10 M | 100 K | 3.6 | 3.0 |
| 8 | 54 M | 540 K | 100 | 9.9 K | 100 K | 100 K | 1.4 | 1.3 |

*Volts$^2 \times 10^{-14}$

In arriving at the calculated values of $N^2$ given in the last column of Table 1, the following parameters were employed:

TABLE 2

| $V_1^2 = 0.77 \times 10^{-14}$ | volts$^2$ |
|---|---|
| $V_2^2 = 4.4 \times 10^{-14}$ | volts$^2$ |
| $I_1^2 = 150 \times 10^{-26}$ | Amps$^2$ |
| $I_2^2 = 4.8 \times 10^{-26}$ | Amps$^2$ |
| $4kTB = 128 \times 10^{-20}$ | volts$^2$/Ω |

The equivalent resistance $R_{eq}$ of the experimental embodiment was 100,000 ohms in each of the experimental trials. Using the value for 4kTB shown in Table 2, one would predict a thermal noise of $12.8 \times 10^{-14}$ volts$^2$ for a passive 100 K Ω resistor. Table 1 indicates that with the exception of experimental trials #1 and #2 the thermal noise of the invention was less than that of an ordinary passive resistor. In each of the other cases, however, the values were not greater than $R_{eq}$ as required for low-noise behavior.

In all cases, it is understood that the above-described arrangements are merely illustrative of but a few of the many possible specific embodiments which can represent applications of the principles of the present invention. Numerous and varied other arrangements can be readily devised in accordance with these principles by those skilled in the art without departing from the spirit and scope of the invention.

What is claimed is:

1. A circuit arrangement having first and second terminals comprising, in combination:
   a first differential-input operational amplifier having a negative feedback resistor $R_p$ and a positive feedback resistor $R_A$ connected between the output and inputs thereof, said first operational amplifier being disposed so that the inverting input thereof is connected to said first terminal;
   a second differential-input operational amplifier having a negative feedback resistor $R_D$ and a positive feedback resistor $R_F$ connected between the output and inputs thereof, said second operational amplifier being disposed so that the inverting input thereof is connected directly to the non-inverting input of said first operational amplifier; and
   means for connecting the non-inverting input of said second operational amplifier to said second terminal.

2. The circuit according to claim 1 wherein the equivalent resistance between terminals 1 and 2 is substantially equal to:

$$\frac{(R_D + R_F)}{M_A M_F} + \frac{R_F}{M_F}$$

where $M_A = R_p/R_A$ and $M_F = R_D/R_F$.

3. The circuit according to claim 2 wherein $M_A/M_F \ll 1$ and $R_A$ and $R_p \gg R_{eq}$.

4. A circuit arrangement having first and second terminals comprising:
   a first and second differential-input operational amplifier, each having an inverting input, a non-inverting input and an output;
   first, second, third, fourth and fifth resistors being serially connected between said first and second terminals;
   means for connecting the inverting input of said first operational amplifier to said first terminal;
   means for connecting the output of said first operational amplifier to the junction of said first and second resistors;
   means for connecting the non-inverting input of said first operational amplifier and the inverting input of said second operational amplifier to the junction of said second and third resistors;
   means for connecting the output of said second operational amplifier to the junction of said third and fourth resistors;
   means for connecting the non-inverting input of said second operational amplifier to the junction of said fourth and fifth resistors; and
   means for connecting the remaining end of said fifth resistor to said second terminal.

* * * * *